(12) United States Patent
Kim (10) Patent No.: US 7,403,149 B2
(45) Date of Patent: Jul. 22, 2008

(54) FOLDING AND INTERPOLATING ANALOG-TO-DIGITAL CONVERTER AND METHOD OF CONVERTING ANALOG SIGNAL TO DIGITAL SIGNAL

(75) Inventor: Kyoung-Ho Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/593,241

(22) Filed: Nov. 6, 2006

(65) Prior Publication Data

US 2007/0115162 A1 May 24, 2007

(30) Foreign Application Priority Data

Nov. 21, 2005 (KR) .................. 10-2005-0111309

(51) Int. Cl.
*H03M 1/12* (2006.01)
(52) U.S. Cl. .................. 341/156; 341/154; 341/159; 341/155
(58) Field of Classification Search ............ 341/156, 341/155, 159, 158, 154; 330/9
See application file for complete search history.

(56) References Cited

U.S. PATENT DOCUMENTS

| 6,674,389 B2 * | 1/2004 | Bult | 341/159 |
| 6,720,901 B2 | 4/2004 | Nakamoto | |
| 6,784,818 B2 * | 8/2004 | Mulder | 341/154 |
| 6,825,716 B2 * | 11/2004 | McGowan | 330/9 |

FOREIGN PATENT DOCUMENTS

| KR | 2000-0027231 | 5/2000 |
| KR | 10-2004-0026907 | 4/2004 |
| KR | 1020050017914 A | 2/2005 |
| KR | 490122 | 5/2005 |

* cited by examiner

*Primary Examiner*—Jean B Jeanglaude
(74) *Attorney, Agent, or Firm*—Mills & Onello LLP (57) ABSTRACT

A folding and interpolating analog,-to-digital converter (ADC) includes a preamp unit, a first folding stage, a second folding stage, a comparison unit and an encoder. The preamp unit receives an analog input signal and reference voltages to generate reference signals. The first folding stage generates a first group of folding signals based on the reference signals. The second folding stage generates a second group of folding signals based the first group. The comparison unit generates a digital code based on the folding signals in the second group. The encoder encodes the digital code. Therefore, the ADC can increase a resolution and a conversion speed, but reduce interpolating errors.

20 Claims, 7 Drawing Sheets

FOLDING AND INTERPOLATING ANALOG-TO-DIGITAL CONVERTER AND METHOD OF CONVERTING ANALOG SIGNAL TO DIGITAL SIGNAL

CROSS-REFERENCE TO RELATED APPLICATIONS

This application claims priority under 35 U.S.C. 119 to commonly owned Korean Patent Application No. 10-2005-0111309 filed on Nov. 21, 2005 in the Korean Intellectual Property Office (KIPO), the entire contents of which are herein incorporated by reference in its entirety.

BACKGROUND OF THE INVENTION

1. Field of the Invention

The present invention relates to an analog-to-digital converter (ADC), and more particularly to a folding and interpolating ADC and a method of converting an analog signal into a digital signal.

2. Description of the Related Art

As demand for wideband digital communications has increased, demand for an analog-to-digital converter (ADC) that can operate faster with better resolution has also increased. Generally, the ADC that operates at a high speed can implement a method such as a flash method, a folding and interpolating method, and a pipeline method.

The folding and interpolating method has advantages including 8-bit through 10-bit resolution, one-step conversion, low power consumption and a small area of an operating system. However, the folding and interpolating method has disadvantages including an increased folding factor in proportion to the resolution of the ADC. The increased folding factor results increases a speed of the ADC, thereby causing a non-linearity of the ADC.

Recent research has been devoted to development of a cascaded folding and interpolating ADC, in which folding stages with a small folding factor are cascade-connected in lieu of using a single folding stage with a large folding factor. One of the cascaded folding and interpolating ADCs is disclosed in Korean Patent Laid-Open Publication No. 2004-26907.

In accordance with the above, the cascaded folding and interpolating ADC adopts an equalization method in a preamp stage and includes a series of resistors for an output operation of first and second folding circuits that are coupled in a cascade fashion so as to interpolate signals.

An input signal of the first folding circuit is interpolated in the preamp stage by using the equalization method. Since the input signal of the first folding circuit can have an interpolating error, an increase in a resolution and a conversion speed of the cascaded folding and interpolating ADC is limited due to an increase in the interpolating error.

SUMMARY OF THE INVENTION

In accordance with some aspects of the present invention, provided is an analog-to-digital converter (ADC) capable of increasing a resolution and a conversion speed and reducing an interpolating error.

In accordance with other aspects of the present invention, provided is a method of converting an analog signal into a digital signal capable of increasing a resolution and a conversion speed and reducing an interpolating error.

In accordance with one aspect of the present invention, provided is a folding and interpolating ADC including a preamp unit, a first folding stage, a second folding stage, a comparison unit and an encoder. The preamp unit is configured to receive an analog input signal and reference voltages having a predetermined voltage interval and to generate therefrom reference signals, each of the reference signals having zero-crossing characteristics at a respective reference voltage. The first folding stage is configured to receive the reference signals and to generate therefrom first folding signals, interpolate the reference signals and to generate therefrom second folding signals, and generate a first group of folding signals based on the first and second folding signals. The second folding stage is configured to receive the folding signals in the first group and to generate therefrom third folding signals, interpolate the folding signals in the first group to generate therefrom fourth folding signals, and to generate a second group of folding signals based on the third and fourth folding signals. The comparison unit is configured to generate a digital code based on the folding signals in the second group of folding signals and the encoder is configured to encode the digital code.

One of the reference signals can be referred as an (i)-th reference signal and a next reference signal can be referred to as an (i+1)-th reference signal, wherein the first folding stage can include a plurality of folding blocks and interpolating folding blocks, including a first folding block configured to receive the (i)-th reference signal and to generate therefrom a corresponding one of the first folding signals; and a first interpolating folding block configured to actively interpolate the (i)-th reference signal and the (i+1)-th reference signal and to generate therefrom a corresponding one of the second folding signals.

The first folding stage can further include a first averaging/interpolating resistor array configured to interpolate the first folding signals and the second folding signals and to generate therefrom the first group of the folding signals.

A folding factor of the first folding stage can correspond to a value of 3, as one example.

The first folding stage can include a first-end folding block at a first end of the first folding stage and a second-end folding block at a second end of the first folding stage and the first averaging/interpolating resistor array can include a first-end averaging/interpolating resistor at the first end and a second-end averaging/interpolating resistor at the second end, wherein the folding blocks and interpolating folding blocks in the first folding stage can be circularly-coupled such that the first-end folding block and the second-end folding block share an input, and the first-end averaging/interpolating resistor and the second-end averaging/interpolating resistor in the first averaging/interpolating resistor array can be circularly-coupled to share an averaging/interpolating resistor input.

One of the folding signals can be referred as an (i)-th folding signal and a next folding signal can be referred to as an (i+1)-th folding signal, wherein the second folding stage can include plurality of folding blocks and interpolating folding blocks, including a second folding block configured to receive the (i)-th folding signal in the second group of folding signals to generate therefrom a corresponding one of the third folding signals, and a second interpolating folding block configured to actively interpolate the (i)-th folding signal and the (i+1)-th folding signal in the first group of folding signals to generate therefrom a corresponding one of the fourth folding signals.

The second folding stage can further include a second averaging/interpolating resistor array configured to interpolate the third folding signals and the fourth folding signals and to generate therefrom the second group of the folding signals.

A folding factor of the second folding stage can correspond to a value of 3, as one example.

The second folding stage can include a first-end folding block at a first end of the second folding stage and a second-end folding block at a second end of the second folding stage and the second averaging/interpolating array can include a first-end averaging/interpolating resistor at the first end and a second-end averaging/interpolating resistor at the second end, wherein the folding blocks and interpolating folding blocks in the second folding stage can be circularly-coupled such that the first-end folding block and the second-end folding block share an input, and the first-end averaging/interpolating resistor and the second-end averaging/interpolating resistor in the second averaging/interpolating resistor array can be circularly-coupled to share an averaging/interpolating resistor input.

The preamp unit can include a track-and-hold (T/H) unit configured to sample the analog input signal and configured to hold the sampled signal for a predetermined time, and a plurality of preamps configured to respectively generate the reference signals corresponding to the sampled signal according to the zero-crossing characteristics of the reference signals.

The preamp unit can further include an averaging resistor array configured to equalize the reference signals outputted from the preamps to reduce errors.

In accordance with another aspect of the present invention, provided is a method of converting an analog signal into a digital signal, wherein the method includes: generating reference signals from a received analog input signal and reference voltages having a predetermined voltage interval, each of the reference signals having zero-crossing characteristics at a respective reference voltage; generating a first group of folding signals based on first folding signals and second folding signals, including generating the first folding signals based on the reference signals and generating the second folding signals by interpolating the reference signals; generating a second group of folding signals based on third folding signals and fourth folding signals, including generating the third folding signals based on the folding signals in the first group of folding signals and generating the fourth folding signals by interpolating the folding signals in the first group of folding signals; and generating a digital code based on the folding signals in the second group of folding signals.

One of the reference signals can be referred as an (i)-th reference signal and a next reference signal can be referred to as an (i+1)-th reference signal, and generating the first group of folding signals can include: generating a corresponding one of the first folding signals based on the (i)-th reference signal; and generating a corresponding one of the second folding signals by actively interpolating the (i)-th reference signal and the (i+1)-th reference signal.

Generating the first group of folding signals can further include: interpolating the first folding signals and the second folding signals to generate first interpolated folding signals; and generating the first group of folding signals based on the first folding signals, the second folding signals and the first interpolated folding signals.

A folding factor for generating the first group can correspond to a value of 3, as one example.

One of the folding signals can be referred as an (i)-th folding signal and a next folding signal can be referred to as an (i+1)-th folding signal, and generating the second group of folding signals can include generating a corresponding one of the third folding signals based on the (i)-th folding signal in the first group; and generating a corresponding one of the fourth folding signals by actively interpolating the (i)-th folding signal and the (i+1)-th folding signal in the first group of folding signals.

Generating the second group of folding signals can further include interpolating the third folding signals and the fourth folding signals to generate second interpolated folding signals; and generating the second group of folding signals based on the third folding signals, the fourth folding signals and the second interpolated folding signals.

A folding factor for generating the second group can correspond to a value of 3, as one example.

Generating reference signals can include equalizing the reference signals.

The reference signals, the folding signals in the first group of folding signals and folding signals in the second group of folding signals respectively include differential pairs.

Therefore, in accordance with various aspects of the present invention, the ADC and the method can increase a resolution and a conversion speed and decrease interpolating errors.

BRIEF DESCRIPTION OF THE DRAWINGS

Various aspects of the invention will become more apparent in view of the attached drawing figures, which are provided by way of example, not by way of limitation, in which.

DESCRIPTION OF THE EMBODIMENTS

Detailed illustrative example embodiments of the present invention are disclosed herein. However, specific structural and functional details disclosed herein are merely representative for purposes of describing example embodiments of the present invention. This invention can, however, be embodied in many alternate forms and should not be construed as limited to the example embodiments set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

It will be understood that, although the terms first, second, etc. can be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Figure 1:
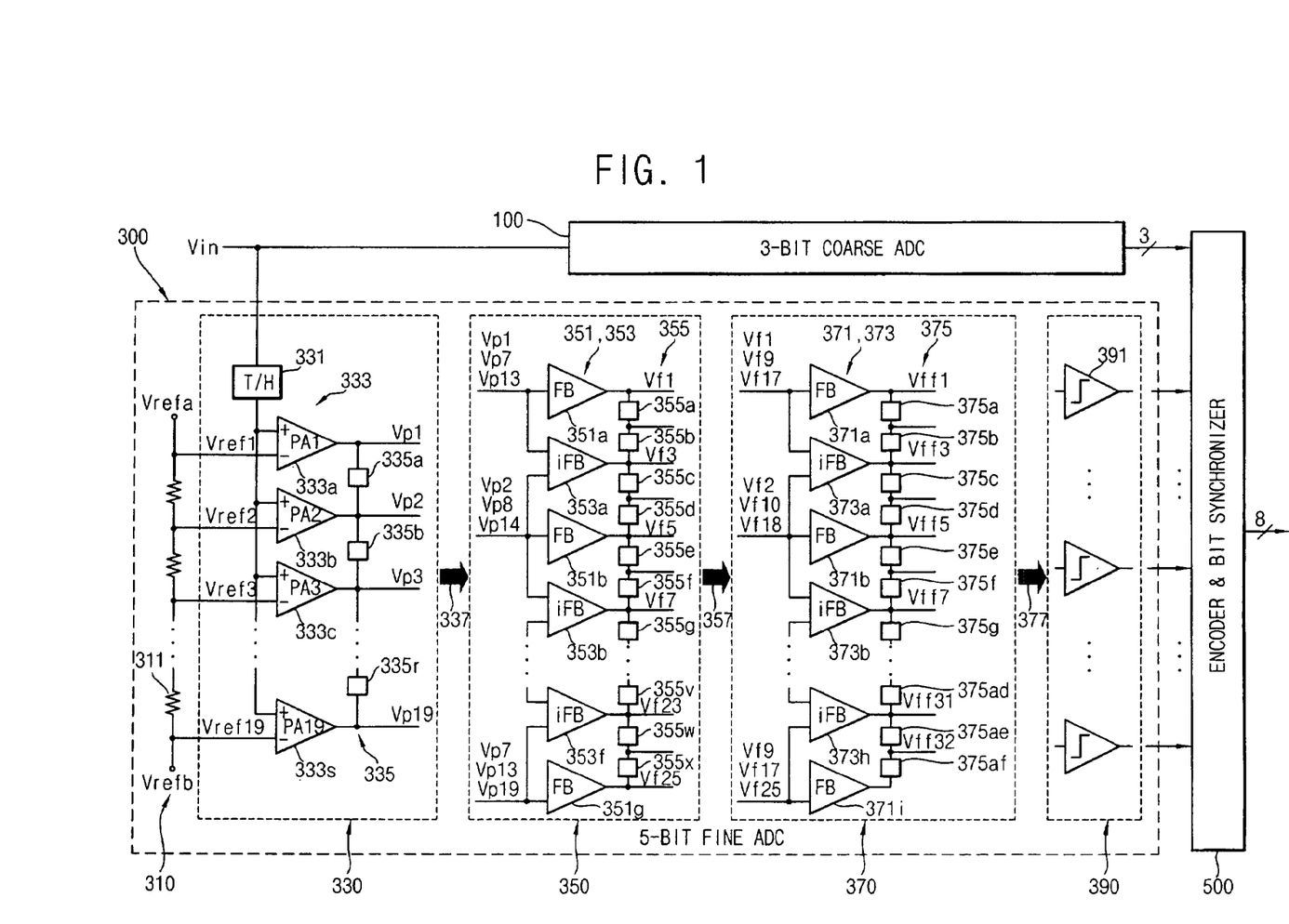
FIG. 1 is a block diagram illustrating an example embodiment of a folding and interpolating analog-to-digital converter (ADC) according to aspects of the present invention.

FIG. 1 is a block diagram illustrating an example embodiment of a folding and interpolating analog-to-digital converter (ADC) according to the present disclosure.

Referring to FIG. 1, the folding and interpolating ADC includes a coarse ADC 100 generating upper bits (for example, three most significant bits), a fine ADC 300 generating lower bits (for example, eight least significant bits), and an encoder 500.

The fine ADC 300 of this embodiment includes a reference voltage generation unit 310, a distributed preamp unit 330, first and second folding stages 350 and 370, and a plurality of comparison units 390.

The distributed preamp unit 330 of this embodiment includes a track-and-hold (T/H) circuit 331, a plurality of preamps 333, and a plurality of averaging resistors 335.

In the example embodiment, the first and second folding stages 350 and 370 of this embodiment respectively include folding blocks (FB) 351, including FBs 351a through 351g, and folding blocks 371, including FBs 371a through 371i. First and second folding stages also respectively include a plurality of interpolating folding blocks (iFB) 353, including iFBs 353a through 353f, and interpolating folding blocks 373, including iFBs 373a through 373h. And the first and second folding stages respectively include a plurality of averaging/interpolating resistor array 355, including resistors 355a through 355x, and resistor array 375, including resistors 375a through 375af.

The second folding stage 370 generates a second group 377 of folding signals Vff1 through Vff32, which are respectively provided to, for example, thirty two comparators 391 in the comparison unit 390.

The averaging/interpolating resistor array 375 in the second folding stage 370 interpolates folding signals outputted from the folding blocks 371 and the interpolating folding blocks 373, and generates interpolated folding signals, which are also included in the second group 377 of folding signals 377. Therefore, the second group 377 of the folding signals Vff1 through Vff32 includes the folding signals outputted from the folding blocks 371 and the interpolating folding blocks 373 and the interpolated folding signals. Accordingly, the second folding stage 370 can include more than eight folding blocks 371 and more than eight interpolating folding blocks 373.

When the folding factor of the second folding stage 370 corresponds to a value of 3, for example, three folding signals among a first group of folding signals Vf1 through Vf25 can be respectively provided to the folding blocks 371 and the interpolating folding blocks 373. Therefore, the first folding stage 350 is designed to provide more than twenty-four folding signals.

The averaging/interpolating resistor array 355 in the first folding stage 350 interpolates reference signals Vp1 through Vp19 outputted from the distributed preamp unit 330 and generates the interpolated folding signals. Because the first group of the folding signals Vf1 through Vf25 includes the folding signals outputted from the folding blocks 351 and the interpolating folding blocks 353 and the interpolated folding signals, the first folding stage 350 can include more than six folding blocks 351 and more than six interpolating folding blocks 353.

When the folding factor of the first folding stage 350 corresponds to a value of 3, for example, three folding signals among the reference signals Vp1 through Vp19 outputted from the distributed preamp unit 330 can be respectively provided to the folding blocks 351 and the interpolating folding blocks 353. Therefore, the distributed preamp unit 330 is designed to provide more than eighteen reference signals.

In some embodiments, in order to decrease interpolation errors, the equalizing interpolation resistor arrays 355 and 375 can be circularly-coupled, and the first and second folding stages 350 and 370 can include additional folding blocks on top or bottom of the folding block.

For example, in the first folding stage, the interpolation errors can be increased in an exterior folding block due to a non-linearity. Therefore, the folding blocks can be circularly-coupled so that the first folding block 351a and the last folding block 351 g can share an input folding signal in order to decrease the interpolation errors. For example, the interpolating folding block 353g can receive three reference signals Vp7, Vp13 and Vp19 as illustrated in FIG. 1.

In some embodiments, additional folding blocks can be inserted at the top of the first folding block 351a and at the bottom of the interpolating folding block 353h (not shown). Similarly, the averaging/interpolating resistor array 355 can be circularly-coupled or additional resistors can be inserted at the top and bottom of the averaging/interpolating resistor array 355.

In addition, the second folding stage 370 can be configured as shown above in the example embodiment.

The reference voltage generation unit 310 generates reference voltages Vref1 through Vref19 between external voltages Vrefa and Vrefb in which respective voltage differences between the neighboring reference voltages Vref1 through Verf19 are nearly equal. For example, the reference voltage generation unit 310 can be implemented as a resistive ladder in which a plurality of resistors 311 having a nearly equal value is coupled in a ladder-like pattern.

The T/H circuit 331 in the distributed preamp unit 330 is a sampling circuit which tracks an input signal Vin and holds the input signal Vin for a predetermined time, and is used for determining a time that a level of a folding signal is settled in the folding and interpolating ADC circuit.

For example, the distributed preamp unit 330 can adopt a single amplifier solution, which generates a single reference signal and estimates a voltage level corresponding to an input signal. However, the single amplifier solution has a disadvantage that an accurate voltage level of the input signal needs to be given in advance.

In some embodiments, the distributed preamp unit 330 can adopt a distributed operation of generating a plurality of reference signals and selecting a single reference signal from the reference signals corresponding to an input signal.

The reference signals have zero-crossing characteristics at a predetermined time interval, and the distributed operation determines whether the input signal is higher or lower than a zero point, instead of accurately estimating a voltage level of the input signal.

In the example embodiments, the distributed preamp unit 333 can adopt a distributed operation and respectively generate the reference signals Vp1 through Vp19 corresponding to the reference voltages Vref1 through Vref19, and a sampling input signal passed through the T/H circuit 331.

The reference signals Vp1 through Vp19 generated by the distributed preamp unit 330 are respectively inputted to the folding blocks 351 and the interpolating folding blocks 353, and the folding blocks 351 and the interpolating folding blocks 353 respectively generate folding signals.

The folding signals have zero-crossing characteristics such that the folding signals cross a zero point at every voltage level of the reference voltages corresponding to the reference signals. The intervals of the folding signals are substantially the same as the intervals of the reference signals.

A folding factor is defined according to an amount of the reference signals crossing a zero point, and the folding factor is also referred to as a folding rate. Generally, when the folding factor is high, a required bandwidth corresponding to the folding factor is undesirably increased. However, in this example embodiment of the present invention, a required bandwidth is not increased although the folding factor of an overall system is high.

Figure 2:
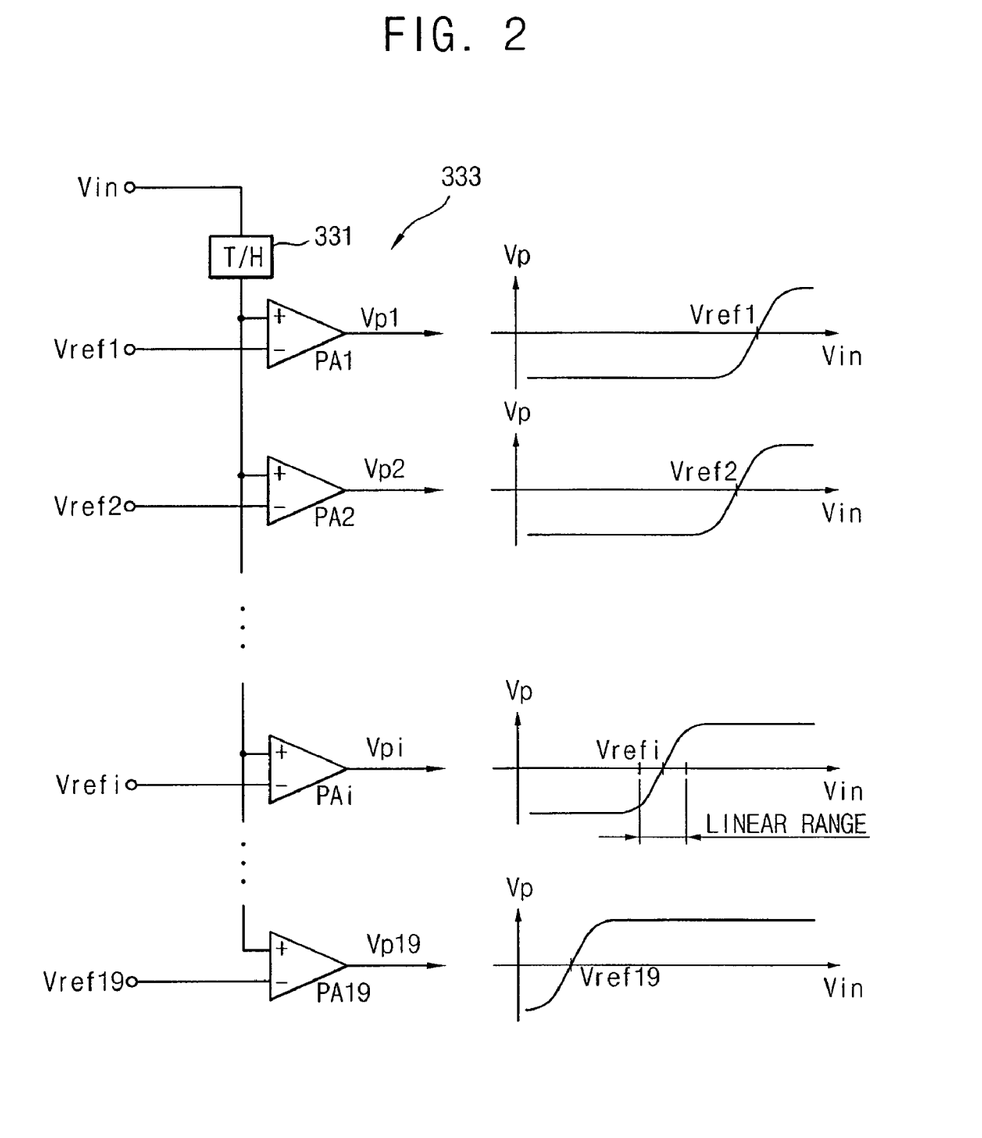
FIG. 2 is a diagram for describing an example embodiment of a distributed preamp unit in FIG. 1.

The distributed preamp unit 330 of FIG. 1 can be better understood with respect to FIG. 2. Consistent with FIG. 1, there are 19 preamps PA1 through PA19, each corresponding to an output signal of the distributed preamp 330. Referring to FIG. 2, a preamp can be generally referred to as a preamp PAi that differentially receives a reference voltage Vrefi and an input signal Vin, which are provided from the reference voltage generation unit 310. From the signals, and the preamp PAi outputs a reference signal Vpi.

The preamp PAi outputs reference signal Vpi with a relatively low voltage level when the input signal Vin is lower than the reference voltage Vrefi. However, the preamp PAi outputs reference signal Vpi with a relatively high voltage level when the input signal Vin is higher than the reference voltage Vrefi. The preamp PAi generates the reference signal Vpi to be substantially equal in level to the corresponding reference voltage Vrefi. That is, as an example, Vp1 will have a voltage level substantially equal to Vref1. Additionally, each of the reference signals Vpi has a zero-crossing form at the intersection point of the input signal Vin and the respective reference voltage Vrefi, from reference voltages Vref1 through Vref19. Therefore, each of the voltage levels between the neighboring reference signals Vpi is nearly equal to each of the voltage levels between the neighboring reference voltages Vrefi.

In the various embodiments, each of the preamps PAi can be implemented as a complementary metal-oxide semiconductor (CMOS) differential pair. However, preamps PAi implemented as a CMOS differential pair have a disadvantage of being prone to an input offset error, such as a mismatch in the CMOS differential pair, a mismatch in a bias current source and so on due to a CMOS manufacturing problem. In such a case, the reference signal Vpi does not cross a zero point due to the input offset error, and thus a resolution and a conversion speed of the folding and interpolating ADC circuit are limited by an error of the reference signal Vpi.

However, the error due to the mismatch of the CMOS differential pair can be decreased by increasing a transistor size of the CMOS differential pair in the preamp PAi, and can also be decreased by equalizing an output of the preamp PAi. The method of equalizing an output of the preamp PAi is be described herein below.

Referring back to FIG. 1, the averaging resistor array 335 includes a plurality of resistors 335a through 335r coupled between output terminals of the distributed preamps 333, which includes preamps 333a through 333s in this embodiment.

Each of the preamps 333 has a linearity in a specific range of an input signal, as illustrated by the linear range of i-th reference signal Vrefi in FIG. 2. When the input signal Vin corresponds to the i-th reference signal, the preamps near or neighboring the i-th preamp PAi operate in a linear way. That is, because an output of the i-th preamp PAi and the neighboring preamps are coupled through an averaging resistor, an error from which preamps operating in a linear way have is averaged, thereby improving linearity of the reference signal Vpi outputted from the preamps PAi and its neighboring preamps. For example if PAi is PA18, which is operating in a linear way, then the errors of the outputs of PA17 and PA18 would be averaged and the errors of the outputs of PA18 and PA19 would be averaged, resulting in output reference signals Vp17, Vp18, and Vp19 having less error.

Also, when the averaging resistor is included at an input terminal of the preamp, such as with resistors 311, the averaging resistor has an effect in which a transistor size of the preamps appears larger. Therefore, the averaging resistor can reduce an error due to the mismatch of the CMOS differential pair regardless of a transistor size of the CMOS differential pair.

In the example embodiments, the averaging resistor array 335 can perform an interpolating operation as well as an averaging operation. Because a voltage level difference between neighboring reference signals is regular, the averaging resistor array 335 can interpolate the two neighboring reference signals and generate a plurality of reference signals between the two neighboring reference signals. As a result, the averaging resistor array 335 can perform an interpolating operation and can reduce the number of preamps.

Figure 3:
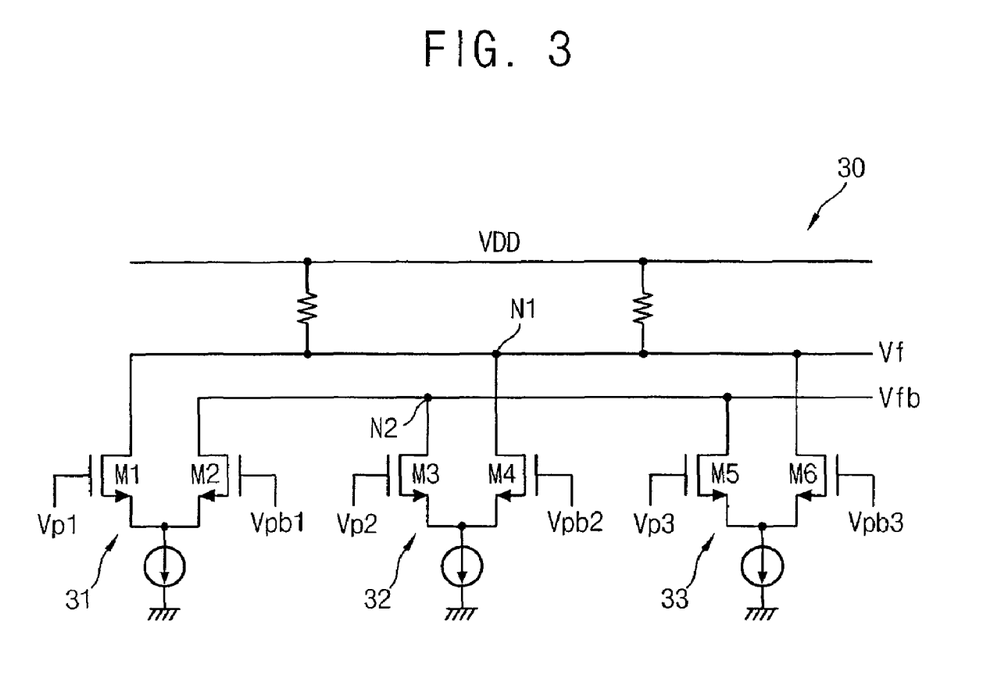
FIG. 3 is a circuit diagram illustrating an example embodiment of the folding block in FIG. 1.

FIG. 3 is a circuit diagram illustrating an example of the folding block in FIG. 1. In FIG. 3, a folding factor in the folding block 30 corresponds to a value of 3, and the folding block 30 has first through third differential pairs 31, 32 and 33.

The first through third differential pairs 31, 32 and 33 respectively receive 3 pairs of reference signals (Vp1 and Vpb1), (Vp2 and Vpb2) and (Vp3 and Vpb3), and differentially output folding signals Vf and Vfb. The three pairs of reference signals (Vp1 and Vpb1), (Vp2 and Vpb2) and (Vp3 and Vpb3) are provided from the preamp unit 330. The folding signal Vf and the inverted folding signal Vfb respectively cross a zero point at the intersection of the input signal Vin and three reference voltages Vref1, Vref2 and Vref3. That is, the folding signal Vf and the inverted folding signal Vfb are folded three times.

If the folding block 30 uses four differential pairs and four reference signals, the folding block 30 can generate a folding signal in which the folding factor corresponds to a value of 4. Thus, the folding block is scalable.

In FIG. 1, the folding blocks 371 and the interpolating folding block 373 in the second folding stage 370 use the folding signals outputted from the first folding stage 350, which forms a differential pair in lieu of the reference signals provided from the preamp unit 330. As a result, the folding signals, which are folded by the number of the folding factors in the first folding stage, are folded again in the second folding stage.

For example, when the folding factor in the first folding stage corresponds to a value of 3 and the folding factor in the second folding stage corresponds to a value of 3, the folding factor in the entire circuit corresponds to a value of 9 (i.e., 3×3), wherein the folding signals are folded 9 times.

Figure 4:
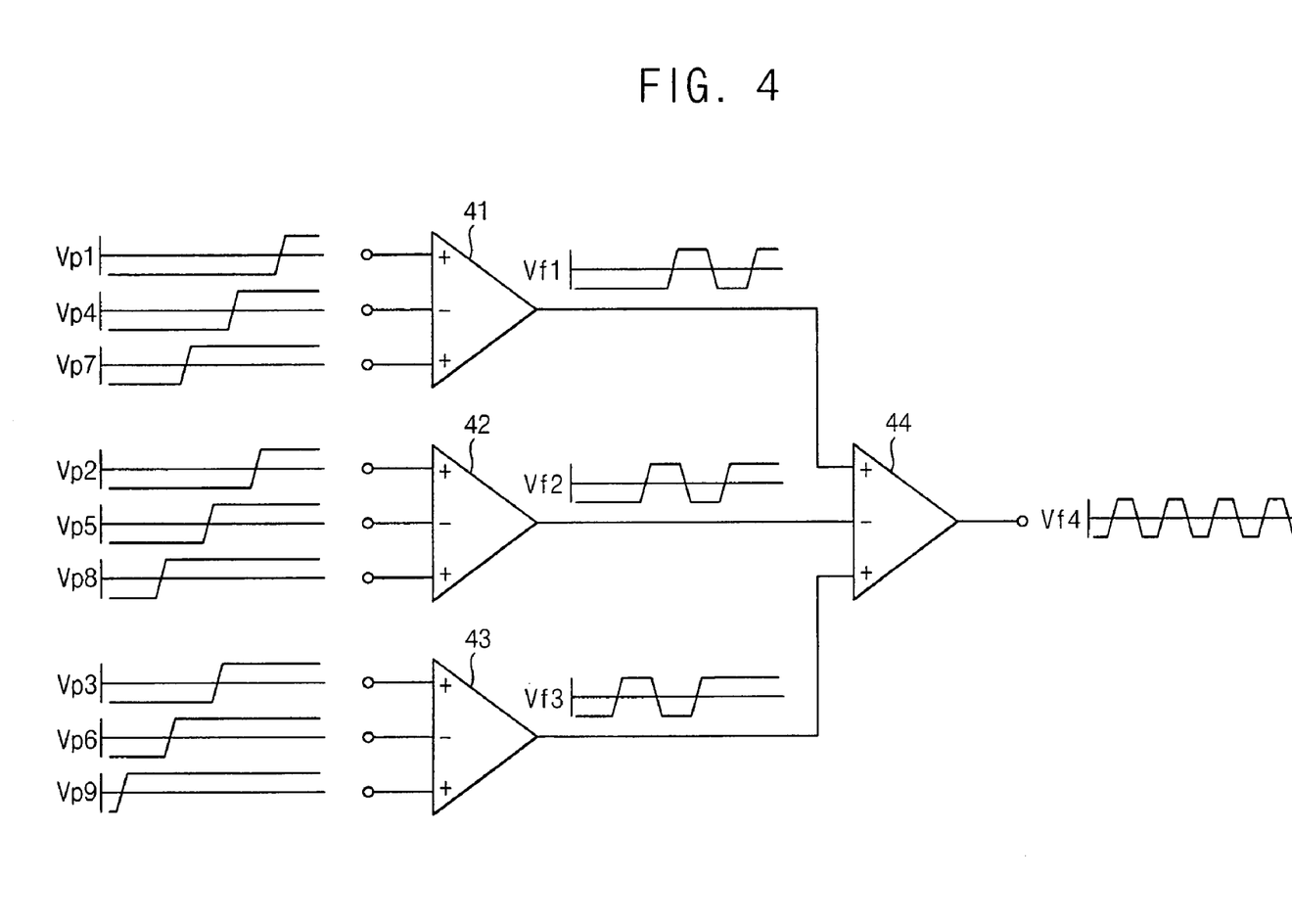
FIG. 4 is a diagram for describing a 3×3 cascaded folding signal in FIG. 1.

FIG. 4 is a diagram for describing a 3×3 cascaded folding signal in FIG. 1. As illustrated in FIG. 4, the folding signal vf4, which is folded 9 times, can be generated by coupling the folding blocks 41 through 44 in which the folding factor corresponds to a value of 3 in a cascaded fashion. Accordingly, as the folding factor is increased, the resolution is increased. However, the bandwidth within which the folding signal can swing in the ADC circuit is also increased.

Each of the reference signals Vp1 through Vp9 has a predetermined voltage interval and some reference signals can be obtained by interpolating between two neighboring reference signals. A method of interpolating reference signals to obtain another reference signal can include interpolating an output of the preamp unit and using a folding block which has an active interpolating input.

Figure 5:
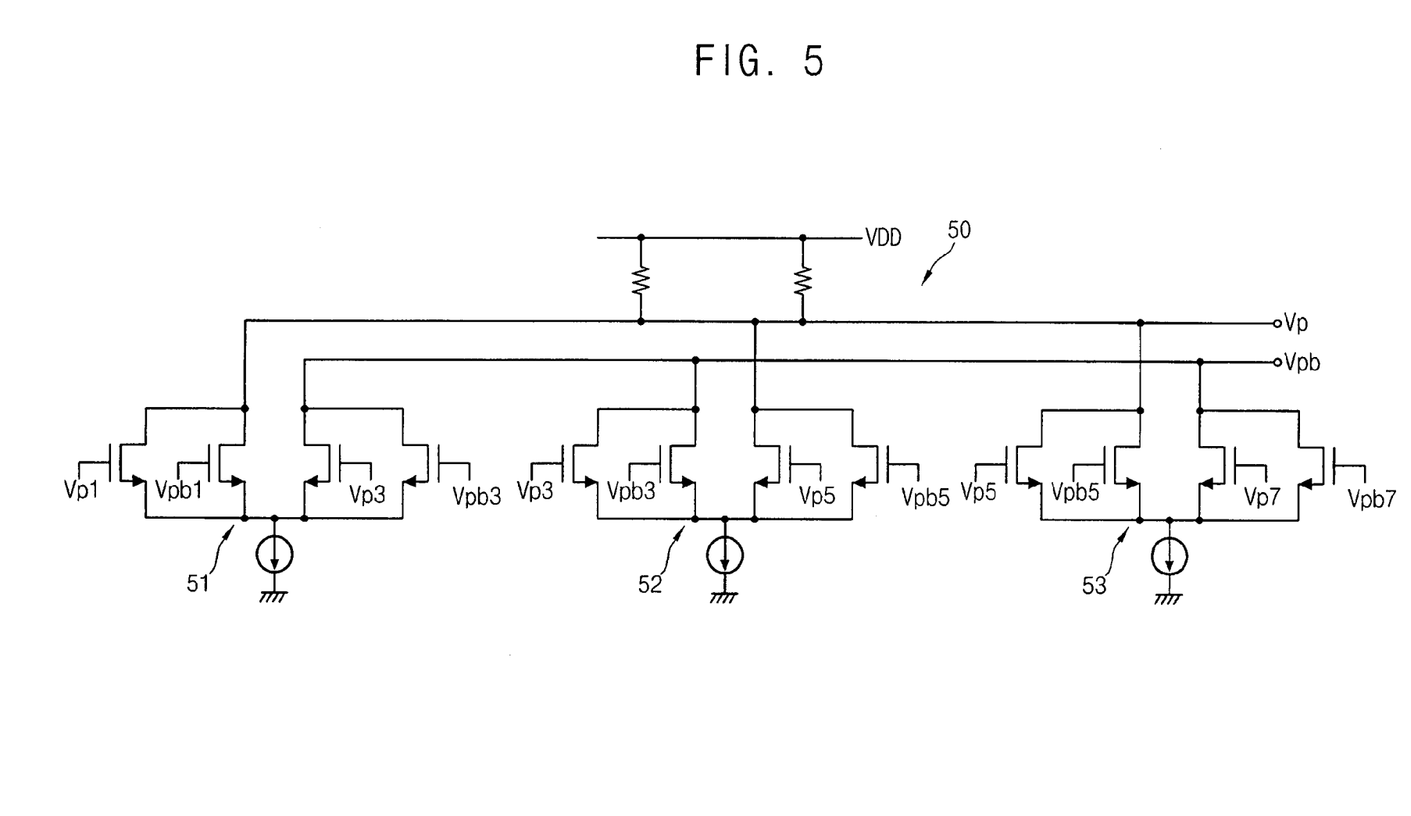
FIG. 5 is a circuit diagram illustrating an example embodiment of the interpolating folding block in FIG. 1.

FIG. 5 is a circuit diagram illustrating an example of an interpolating folding block 50, as the interpolating folding block 350 in FIG. 1.

Referring to FIG. 5, the interpolating folding block 50 includes second, fourth and sixth differential pairs 51, 52 and 53. The folding factor of the interpolating folding block 50 corresponds to a value of 3 and each of the differential pairs 51, 52 and 53 has four inputs.

The second differential pair 51 interpolates first and third reference signals (Vp1 and Vpb1) and (Vp3 and Vpb3), which form a differential pair, to generate second reference signals, which also form a differential pair.

The fourth differential pair 52 interpolates third and fifth reference signals (Vp3 and Vpb3) and (Vp5 and Vpb5), which form a differential pair, to generate fourth reference signals, which also form a differential pair.

The sixth differential pair 53 interpolates fifth and seventh reference signals (Vp5 and Vpb5) and (Vp7 and Vpb7), which form a differential pair, to generate sixth reference signals, which also form a differential pair.

The interpolating folding block 50 uses the second, fourth and sixth differential pairs 51, 52 and 53 to generate the second, fourth and sixth reference signals, and can generate folding signals Vp and Vpb.

When the interpolating folding block 50 includes four differential pairs and interpolates four differential reference signals, the interpolating folding block 50 can generate a folding signal in which a folding factor corresponds to a value of 4.

When the number of the reference signal and the reference voltage is decreased, the reference voltage generation unit 310 can be simplified and the number of the preamp units can be decreased. A method of interpolating outputs of the preamp units by using a resistor array can not reduce interpolating errors, but the active interpolating method described above can further reduce interpolating errors because of a common mode injection of a differential pair included in the interpolating folding block.

Referring back to FIG. 1, the first folding stage 350 includes seven first folding blocks 351a through 351g and six interpolating folding blocks 353a through 353f. The folding factor in the first folding stage 350 corresponds to a value of 3.

The first folding block 351a receives three pairs of reference signals Vp1, Vp7 and Vp13, each forming a differential pair, to generate the first folding signal Vf1. The first interpolating folding block 353a receives six pairs of reference signals Vp1, Vp7, Vp13, Vp2, Vp8 and Vp14, each forming a differential pair, to generate the third folding signal Vf3.

Other folding blocks 351b through 351g and interpolating folding blocks 353b through 353f, respectively, receive reference signals to generate respective folding signals. The folding signals 357 are provided to the second folding stage 370.

The second folding stage 370 includes nine folding blocks 371a through 371i and eight interpolating folding blocks 373a through 373h, and the folding factor in the second folding stage 370 corresponds to a value of 3. The folding blocks 371a through 371i and the interpolating folding blocks 373a through 373h, respectively, receive reference signals to generate respective folding signals, as shown in the above first folding stage 350.

The averaging/interpolating resistor arrays 355 and 375 are respectively coupled to an output terminal of the folding blocks in the first and second folding stages 350 and 370. Because each of the folding signals has a predetermined voltage interval, any folding signal can be obtained by interpolating (e.g., averaging) the neighboring folding signals. When linearity is ensured, more folding signals can be generated by interpolating the neighboring folding signals.

The interpolating method described above can reduce the number of the folding blocks. However, the interpolating resistor can be a factor that limits a bandwidth of an input signal because the interpolating resistor increases an input resistance of the system.

The comparison unit 390 includes a plurality of comparators 391 and each of the comparators 391 receives folding signals 377 outputted from the second folding stage 370 to generate a digital code corresponding to the input signal Vin. For example, the comparison unit 390 can generate a thermometer code based on input temperature signals. Each of the comparators 391 receives first and second signals forming a differential pair, and can generate a code value '0' when the first signal is greater than the second signal and a code '1' otherwise.

Continuing with the thermometer code example, the encoder 500 uses the thermometer code received from the coarse ADC 100 and the comparison unit 390 of the fine ADC 300 to generate a digital conversion code corresponding to the analog input signal Vin.

Because a circuit configuration of the coarse ADC 100 differs from that of the fine ADC 300, a signal delay time of the coarse ADC 100 can not be equal to that of the fine ADC 300. Therefore, the encoder 500 can further include a bit synchronizer to synchronize signals respectively outputted from the coarse ADC 100 and the fine ADC 300.

Figure 6:
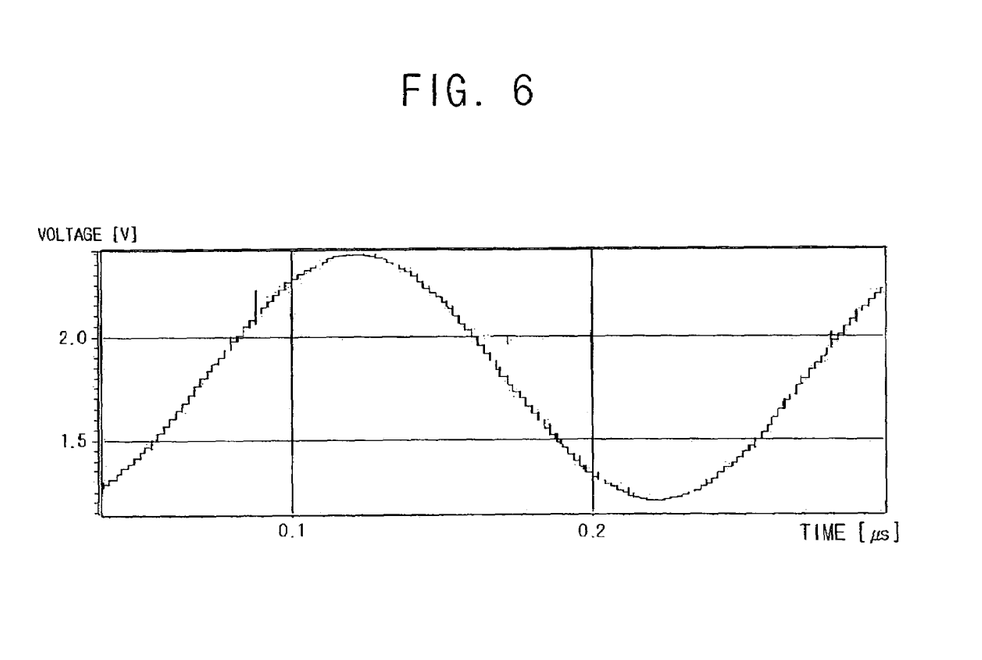
FIGS. 6, 7 and 8 are graphs illustrating simulation results of the ADC in FIG. 1.
Figure 7:
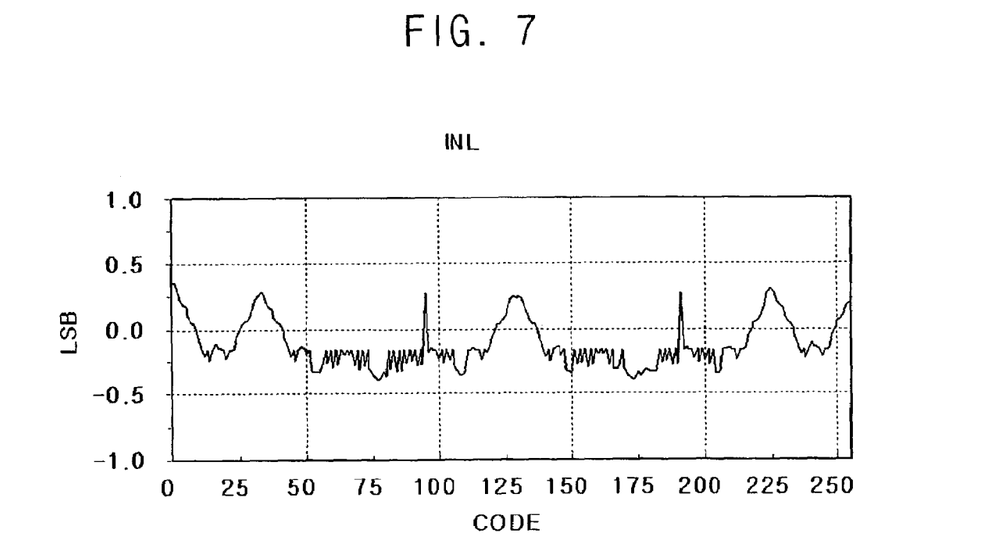
Figure 8:
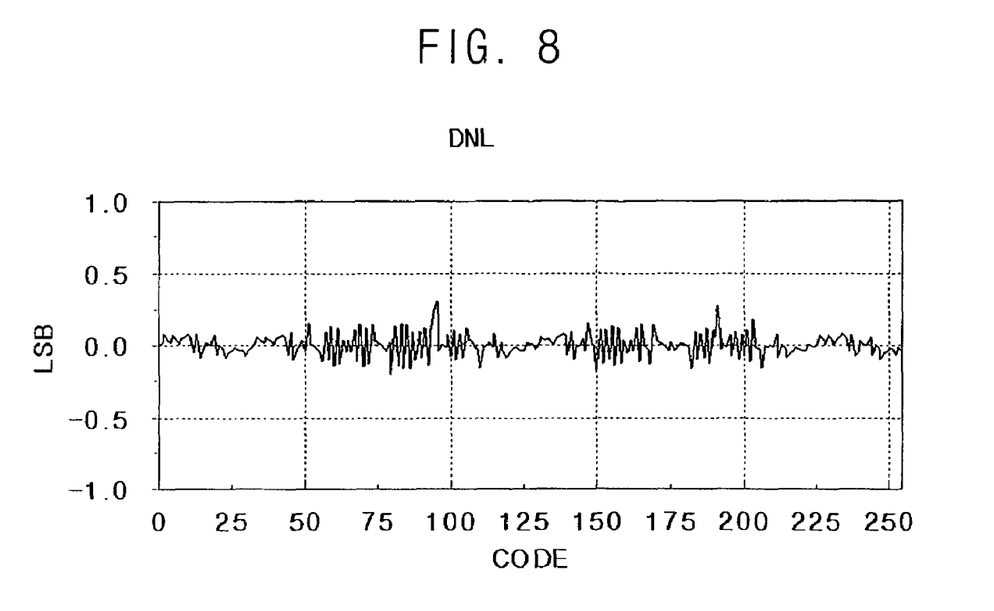

FIGS. 6, 7 and 8 are graphs illustrating simulation results of the ADC in FIG. 1. In FIGS. 6, 7 and 8, the ADC is assumed to have an 8-bit resolution and a sampling speed of a 500 MSPS. Although, other resolutions and speeds can be used in other embodiments.

The graph in FIG. 6 illustrates a wave generated by converting an input sine wave of a 5 MHz frequency and a 1.2V amplitude into a digital signal of a sampling rate corresponding to 500 MSPS, and re-converting the converted digital signal into an analog signal. As shown in FIG. 6, the ADC according to an example embodiment has few errors when the ADC converts the analog signal into the digital signal at a 500 MSPS rate.

Generally, an error in the ADC is indicated as integral non-linearity (INL) and differential non-linearity (DNL). The INL and DNL represent a relative magnitude between an absolute magnitude of a signal and a noise signal as a least significant bit (LSB). Generally, the ADC can convert an analog signal into a digital signal with substantially no error when both the INL and DNL are less than 0.5 LSB.

As shown in FIGS. 7 and 8, when an input sine wave having a frequency of 5 MHz is converted into a digital signal at a 500 MSPS rate, by the ADC according to an example embodiment, the INL and DNL are distributed between −0.5 LSB and 0.5 LSB, and an error in the ADC does not occur.

As described above, the cascaded folding and interpolating ADC, according to above example embodiments, equalizes an output of the preamp units generating reference signals to reduce input offset errors, and can reduce an interpolating error by using an interpolating and folding block, which adopts an active interpolating method, as described above.

Further, the cascaded folding and interpolating ADC can equalize outputs of the folding blocks, and thereby reduce the number of the folding blocks even when the folding factor of the ADC is high.

Furthermore, the cascaded folding and interpolating ADC, according to above example embodiments, can operate fast due to a cascaded configuration and reduce the chip size by having the smaller number of the preamp units and the folding blocks.

While the foregoing has described what are considered to be the best mode and/or other preferred embodiments, it is understood that various modifications may be made therein and that the invention or inventions may be implemented in various forms and embodiments, and that they may be applied in numerous applications, only some of which have been described herein. It is intended by the following claims to claim that which is literally described and all equivalents thereto, including all modifications and variations that fall within the scope of each claim.

What is claimed is:

1. A folding and interpolating analog-to-digital converter (ADC), comprising:
   a preamp unit configured to receive an analog input signal and reference voltages having a predetermined voltage interval and to generate therefrom an equal number of reference signals, each of the reference signals having zero-crossing characteristics at a respective reference voltage;
   a first folding stage configured to receive the reference signals and to generate therefrom first folding signals, configured to interpolate the reference signals using both active interpolation and resistor interpolation and to generate therefrom second folding signals, and configured to generate a first group of folding signals having zero-crossing characteristics based on the first and second folding signals, wherein each folding signal in the first group of folding signals crosses a zero point at a voltage level of a reference voltage of a corresponding reference signal;
   a second folding stage configured to receive the folding signals in the first group of folding signals and to generate therefrom third folding signals, configured to interpolate the folding signals in the first group of folding signals using both active interpolation and resistor interpolation and to generate therefrom fourth folding signals, and configured to generate a second group of folding signals based on the third and fourth folding signals;
   a comparison unit configured to generate a digital code based on the second group of folding signals; and
   an encoder configured to encode the digital code.

2. The ADC of claim 1, wherein one of the reference signals can be referred as an (i)-th reference signal and a next one of the reference signals can be referred to as an (i+1)-th reference signal, and wherein the first folding stage comprises a plurality of folding blocks and interpolating folding blocks including:
   a first folding block configured to receive the (i)-th reference signal and to generate therefrom a corresponding one of the first folding signals; and
   a first interpolating folding block configured to actively interpolate the (i)-th reference signal and the (i+1)-th reference signal and to generate therefrom a corresponding one of the second folding signals.

3. The ADC of claim 2, wherein the first folding stage further comprises a first averaging/interpolating resistor array configured to interpolate the first folding signals and the second folding signals and to generate therefrom the first group of the folding signals.

4. The ADC of claim 3, wherein a folding factor of the first folding stage corresponds to a value of 3.

5. The ADC of claim 3, wherein the first folding stage includes a first-end folding block at a first end of the first folding stage and a second-end folding block at a second end of the first folding stage and the first averaging/interpolating resistor array includes a first-end averaging/interpolating resistor at the first end and a second-end averaging/interpolating resistor at the second end, and
   the folding blocks and interpolating folding blocks in the first folding stage are circularly-coupled such that the first-end folding block and the second-end folding block share an input, and the first-end averaging/interpolating resistor; and
   the second-end averaging/interpolating resistor in the first averaging/interpolating resistor array are circularly-coupled to share an averaging/interpolating resistor input.

6. The ADC of claim 1, wherein one of the folding signals can be referred as an (i)-th folding signal and a next folding signal can be referred to as an (i+1)-th folding signal, and wherein the second folding stage comprises a plurality of folding blocks and interpolating folding blocks including:
   a second folding block configured to receive the (i)-th folding signal in the first group of folding signals and to generate therefrom a corresponding one of the third folding signals; and
   a second interpolating folding block configured to actively interpolate the (i)-th folding signal and the (i+1)-th folding signal in the first group of folding signals and to generate therefrom a corresponding one of the fourth folding signals.

7. The ADC of claim 6, wherein the second folding stage further comprises a second averaging/interpolating resistor array configured to interpolate the third folding signals and the fourth folding signals and to generate therefrom the second group of the folding signals.

8. The ADC of claim 7, wherein a folding factor of the second folding stage corresponds to a value of 3.

9. The ADC of claim 7, wherein the second folding stage includes a first-end folding block at a first end of the second folding stage and a second-end folding block at a second end of the second folding stage and the second averaging/interpolating array includes a first-end averaging/interpolating resistor at the first end and a second-end averaging/interpolating resistor at the second end, and
   the folding blocks and interpolating folding blocks in the second folding stage are circularly-coupled such that the first-end folding block and the second-end folding block share an input; and the first-end averaging/interpolating resistor and the second-end averaging/interpolating resistor in the second averaging/interpolating resistor array are circularly-coupled to share an averaging/interpolating resistor input.

10. The ADC of claim 1, wherein the preamp unit comprises:
   a track-and-hold (T/H) unit configured to sample the analog input signal and configured to hold the sampled signal for a predetermined time; and
   a plurality of preamps configured to respectively generate the reference signals corresponding to the sampled signal according to the zero-crossing characteristics of the reference signals.

11. The ADC of claim 10, wherein the preamp unit further comprises an averaging resistor array configured to equalize the reference signals outputted from the preamps to reduce errors.

12. A method of converting an analog signal into a digital signal, comprising:
   generating reference signals from a received analog input signal and an equal number of reference voltages having a predetermined voltage interval, each of the reference signals having zero-crossing characteristics at a respective reference voltage;
   generating a first group of folding signals having zero-crossing characteristics based on first folding signals and second folding signals, the first folding signals being generated based on the reference signals and the second folding signals being generated by interpolating the reference signals using both active interpolation and resistor interpolation, wherein each folding signal in the first group of folding signals crosses a zero point at a voltage level of a reference voltage of a corresponding reference signal;
   generating a second group of folding signals based on third folding signals and fourth folding signals, the third folding signals being generated based on the folding signals in the first group of folding signals and the fourth folding signals being generated by interpolating the folding signals in the first group of folding signals using both active interpolation and resistor interpolation; and
   generating a digital code based on the folding signals in the second group of folding signals.

13. The method of claim 12, wherein one of the reference signals can be referred as an (i)-th reference signal and a next reference signal can be referred to as an (i+1)-th reference signal, and wherein generating the first group of folding signals comprises:

generating a corresponding one of the first folding signals based on the (i)-th reference signal; and
generating a corresponding one of the second folding signals by actively interpolating the (i)-th reference signal and the (i+1)-th reference signal.

14. The method of claim 13, wherein generating the first group of folding signals further comprises:
   interpolating the first folding signals and the second folding signals to generate first interpolated folding signals; and
   generating the first group of folding signals based on the first folding signals, the second folding signals and the first interpolated folding signals.

15. The method of claim 14, wherein a folding factor for generating the first group of folding signals corresponds to a value of 3.

16. The method of claim 12, wherein one of the folding signals can be referred as an (i)-th folding signal and a next folding signal can be referred to as an (i+1)-th folding signal, and wherein generating the second group of folding signals comprises:
   generating a corresponding one of the third folding signals based on the (i)-th folding signal in the first group of folding signals; and
   generating a corresponding one of the fourth folding signals by actively interpolating the (i)-th folding signal and the (i+1)-th folding signal in the first group of folding signals.

17. The method of claim 16, wherein generating the second group of folding signals further comprises:
   interpolating the third folding signals and the fourth folding signals to generate second interpolated folding signals; and
   generating the second group of folding signals based on the third folding signals, the fourth folding signals and the second interpolated folding signals.

18. The method of claim 17, wherein a folding factor for generating the second group of folding signals corresponds to a value of 3.

19. The method of claim 12, wherein generating reference signals comprises equalizing the reference signals.

20. The method of claim 12, wherein the reference signals, the folding signals in the first group of folding signals and folding signals in the second group of folding signals respectively include differential pairs.

* * * * *